INVENTOR.
Robert H. Dicke
BY
J. L. Whittaker
ATTORNEY

TUNABLE ATOMIC AMPLIFIER OR OSCILLATOR

Filed March 12, 1956 2 Sheets-Sheet 2

INVENTOR.
Robert H. Dicke
BY J. C. Whittaker
ATTORNEY

United States Patent Office 2,940,050

Patented June 7, 1960

2,940,050

TUNABLE ATOMIC AMPLIFIER OR OSCILLATOR

Robert H. Dicke, 37 Jefferson Road, Princeton, N.J.

Filed Mar. 12, 1956, Ser. No. 571,077

11 Claims. (Cl. 330—4)

This invention relates generally to microwave amplifiers and oscillators, and particularly to a tunable amplifier or oscillator which utilizes energy level transitions between the atoms or molecules of a microwave resonant medium.

An object of the invention is to provide a novel and improved atomic or molecular amplifier or oscillator.

Another object of the invention is to provide a novel and improved microwave amplifier or oscillator which employs a microwave resonant medium and is tunable over a range of frequencies.

Still another object is to provide an amplifier or oscillator of the above type which employs a photon absorption phenomenon.

Various other objects and advantages will be apparent as the nature of the invention is more fully disclosed.

A class of microwave devices is known which may be termed "atomic or molecular" amplifiers and oscillators. Such devices employ microwave resonant media and utilize the phenomenon that these media are capable of emitting or absorbing microwave energy at one or more discrete frequencies at which the media exhibit resonance.

In one type of apparatus in this general class, the atoms or molecules of the particular microwave resonant medium chosen are contained in a cavity resonator and initially are in a condition of thermal equilibrium. A magnetic field of fixed field strength is applied to the resonant medium to resolve the degeneracy of its magnetic substates. Photon resonance radiation is then applied to the medium to disturb the thermal equilibrium condition of the atoms or molecules by inducing energy level transitions and thereby to produce an increased population of preferred atomic or molecular quantum energy levels. The technique for producing the increased populations of certain quantum energy levels is known as "optical pumping." In some instances the preferred population condition is such that a spectral line exhibited by the medium is of greatly increased intensity and the apparatus may be utilized in a microwave spectroscopy or frequency stabilization system. In other instances the preferred population condition is such that more atoms are in the upper of two energy levels related to a microwave transition than in the lower, and the apparatus may be utilized to amplify or generate microwave energy at the frequency determined by these energy levels.

The various objects and advantages of the present invention are achieved by employing circularly polarized photon energy to irradiate said medium which is subjected to a circular microwave mode, and, if desired, by impressing a magnetic tuning field having an adjustable field strength on the microwave resonant medium. By selecting magnetic substates of the medium which have their state populations such that more atoms are in the upper of the two energy states of interest, and which have a magnetic field strength dependence, the medium coherently emits or radiates microwave energy at a frequency determined by the strength of the variable magnetic field. With the intensity of the coherent radiation or emission sufficient to exceed the usual cavity resonator losses, the apparatus is capable of either amplifying or generating microwave electromagnetic energy within a band of frequencies.

The invention is described more in detail in connection with the accompanying drawing, in which.

Similar reference numerals are applied to similar elements throughout the drawing.

Figure 1:
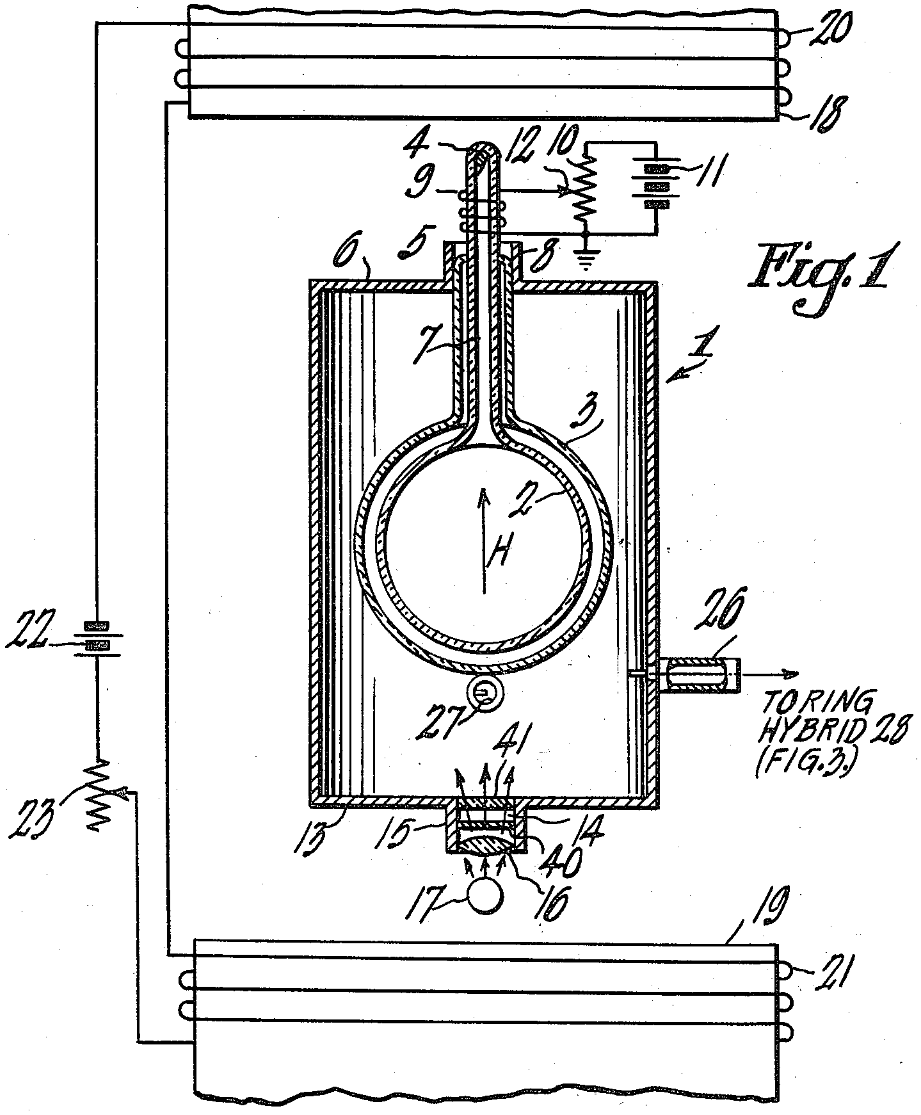
Fig. 1 is a schematic diagram of an embodiment of the invention showing the tunable amplifier in sectional elevation without its external connections.

Referring to Fig. 1, a cavity resonator 1 is shown which operates in its circular $TE_{112}$ mode. The material from which the resonator 1 is formed should be non-magnetic, for example, copper or aluminum. The resonator 1 is of cylindrical shape with its axis shown extending vertically. Centrally disposed in the resonator 1 is the bulb portion 2 of a transparent envelope designated generally as 3. The envelope 3 may comprise, for example, a double walled Dewar flask which contains a microwave resonant medium. The resonant medium, further by way of example, may comprise a gas such as a metallic vapor such as $Na^{23}$ or $Cs^{133}$ or $Rb^{87}$.

In the instant embodiment, it is assumed that sodium ($Na^{23}$) has been chosen as the resonant medium. The metallic sodium 4 in its liquid state is disposed in the neck portion 5 of envelope 2. The neck portion 5 extends above the top wall 6 of resonator 1 through an aperture 7 encircled by a collar 8. A heating element 9 is disposed around the neck portion 5 below the sodium 4. The heating element 9 is supplied with current from an adjustable potentiometer 10 connected to a battery 11. The movable arm 12 of potentiometer 10 may be adjusted to increase or decrease the current supplied to heating element 9 and thereby either increase or decrease the pressure of the sodium vapor in the bulb portion 2. In the present example, the sodium vapor pressure is adjusted to be not more than $10^{-2}$ millimeters of mercury and preferably is between $10^{-4}$ and $10^{-6}$ millimeters of mercury.

The bottom wall 13 of resonator 1 is apertured at 14 and provided with a collar 15 which encircles the aperture 14. An optical lens 16 is mounted in the collar 15 just below the aperture 14. The lens 16 focuses photon excitation energy, emanating from a sodium-D lamp 17, onto the sodium vapor confined within the bulb portion 2 of envelope 3. Sodium-D lamps suitable for use with the structure set forth above are commercially available. Between the lens 16 and bulb 2 are Polaroid sheet 40, which plane-polarizes the photon excitation energy from lamp 17 and quarter-wave plate 41 which converts the plane-polarized light from sheet 40 to circularly polarized light. This circularly polarized light is then incident on the vapor in bulb 2. The quarter-wave plate 41 may be made of a sheet of split mica or quartz.

If a resonant medium other than sodium vapor is utilized, it is to be understood that a different type of photon excitation lamp will be required. For example, if caesium is employed as the resonant medium, a caesium lamp will be necessary to supply the required circularly polarized photon excitation.

A constant magnetic field of adjustable intensity is provided by pole pieces 18 and 19 disposed, respectively, above and below the resonator 1. The pole pieces 18 and 19 are provided with electromagnetic excitation windings 20 and 21 which are connected in series and supplied with direct current from a battery 22 through a rheostat 23. The intensity of the constant magnetic field which is directed axially along the arrow H through the resonator 1 and the microwave resonant sodium vapor in bulb 2 may thus be adjusted by means of rheostat 23.

Figure 3:
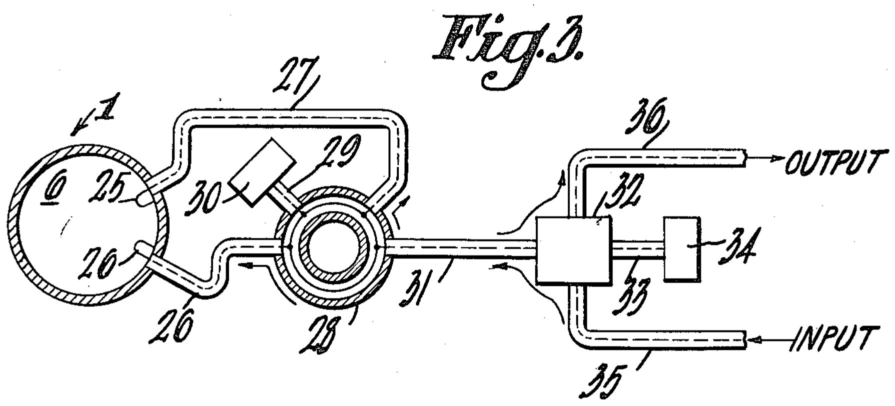
Fig. 3 is a schematic diagram in plan view showing the external connections with the details of the amplifier omitted.

Referring now to Fig. 3, the cavity resonator 1 is circularly excited in its $TE_{112}$ mode by two coupling loops 24 and 25 which are fed by coaxial lines 26 and 27 from a conventional hybrid circuit 28 of the ring type.

The lengths of coaxial lines 26 and 27 are adjusted so that the coupling loops 24 and 25 are driven 90° out of phase, thus producing the desired circular $TE_{112}$ mode. The unused circuit 29 extending from the ring hybrid 28 is connected to a termination 30 to damp and prevent undesired modes of operation. The ring hybrid 28 is fed over a transmission path 31 by the output of a one-way four junction 32 employing a ferrite element of the type described in Bell System Tech. Jour. of January 1952, vol. 31, page 1, or in Bell Tel. System Monograph No. 1959 by C. L. Hogan. The unused circuit 33 of the one-way four junction 32 is provided with a termination 34 which, like the termination 30, damps and prevents undesired modes of operation. Input and output transmission paths 35 and 36 extend from the junction 32 to utilization means (not shown).

Figure 2:
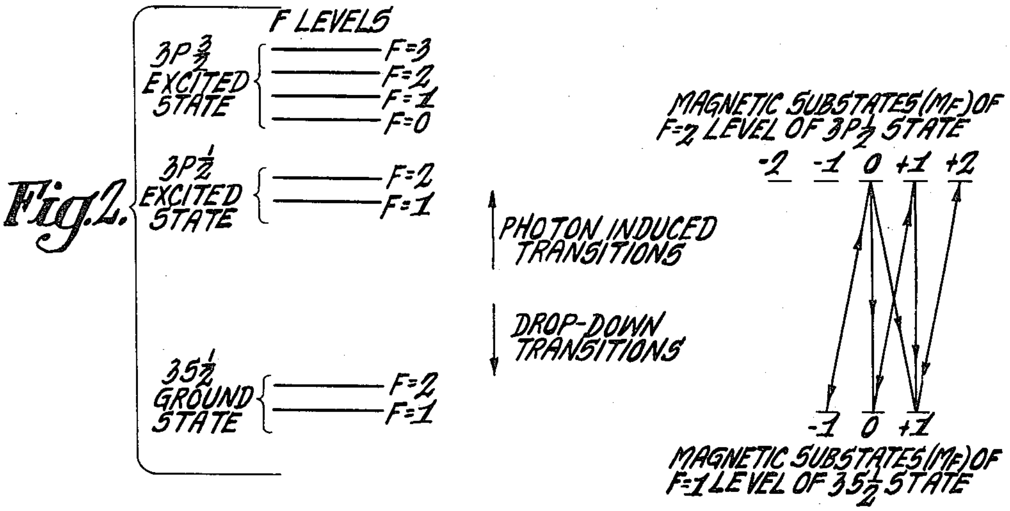
Fig. 2 is a partial energy level diagram for atomic sodium, showing certain transitions which are permitted to occur between various quantum energy states in accordance with the invention.

The operation of the structure described in the foregoing paragraphs is believed to be as follows. The sodium atoms initially are in a $3S_{1/2}$ ground state. Considering that the nuclear spin I is $$\frac{3}{2}$$

the permitted magnetic substates of the $F=1$ energy level of the $3S_{1/2}$ ground state and the permitted magnetic substates of the $F=2$ energy level of the $3P_{1/2}$ excited state are as shown in Fig. 2. The degeneracy of these magnetic substates is resolved by application to the vapor of the weak magnetic field H.

The photon energy of the sodium-D lamp is such as to excite the microwave resonant sodium vapor in the envelope 2 to induce energy level transitions from each of the hyperfine levels $F=1$ and $F=2$ of the $3S_{1/2}$ ground state to any of the hyperfine levels of either the $3P_{1/2}$ excited state ($F=1$, $F=2$) or the $3P_{3/2}$ excited state ($F=0$, $F=1$, $F=2$, $F=3$).

Since the excitation from sodium-D lamp 17 is circularly polarized, and assuming it to be polarized in a right-hand sense, the induced transitions follow a selection rule of $\Delta M_F=+1$. If the sodium-D excitation is polarized in the reverse sense, the photon induced transitions follow the selection rule $\Delta M_F=-1$.

Consider for the moment only transitions between the $F=1$ level of the $3S_{1/2}$ ground state and the $F=2$ level of the $3P_{1/2}$ excited state. With the photon excitation polarized in the right hand sense, and with the magnetic field H applied to the vapor to resolve degeneracy of the magnetic substates, induced transitions occur between the magnetic substate $M_F=-1$ of the $F=1$ level of the $3S_{1/2}$ ground state and the magnetic substate $M_F=0$ of the $F=2$ level of the $3P_{1/2}$ excited state. The induced transitions are followed by spontaneous drop-down transitions from the $F=2$, $M_F=0$ substate of the $3P_{1/2}$ excited state to any of the magnetic substates $M_F=-1$, $M_F=0$, $M_F=+1$ of the $F=1$ level of the $3S_{1/2}$ state. Similarly, photon induced transitions from the $M_F=0$ substate of the $F=1$ level of the $3S_{1/2}$ ground state to the $M_F=+1$ substate of the $F=2$ level of the $3P_{1/2}$ excited state occur and are followed by drop-down transitions to the $M_F=0$ and $M_F=+1$ substates of the $F=1$ level of the $3S_{1/2}$ state. Also, photon induced transitions from the $M_F=+1$ substate of the $F=1$ level of the $3S_{1/2}$ state to the $M_F=+2$ substate of the $F=2$ level of the $3P_{1/2}$ state result which are followed by drop-down transitions to the $M_F=+1$ substate of the $F=1$ level of the $3S_{1/2}$ state.

As a result of the above-described photon induced transitions and the ensuing drop-down transitions, net angular momentum is transferred to the vapor, since one unit ($h/2\pi$ where $h$ is Plank's constant) of angular momentum is absorbed by the vapor with each absorbed photon, whereas on the average there is no net transfer of angular momentum in the ensuing drop-down transitions. This results in an enhancement of the number of sodium atoms in the $M_F=+1$ magnetic substate of the $F=1$ level of the $3S_{1/2}$ state, and a decrease in the number of sodium atoms in the $M_F=-1$ magnetic substate.

If now all possible transitions between both hyperfine levels $F=1$ and $F=2$ of the $3S_{1/2}$ ground state and all hyperfine levels of both the $3P_{1/2}$ and $3P_{3/2}$ excited states are considered, there is a net redistribution of atoms among the substates of the ground state atoms. This new population distribution comprises a preferred angular momentum orientation. At thermal equilibrium, all magnetic substates of the $F=1$ hyperfine level of the $3S_{1/2}$ ground state are essentially equally populated, as are the magnetic substates of the $F=2$ hyperfine level, whereas after a single photon of sodium-D excitation is absorbed and re-emitted by each sodium atom, there are 6.18 times as many atoms in the $M_F=+2$ substate as in the $M_F=-2$ substate of the $F=2$ hyperfine level, and 2.43 times as many atoms in the $M_F=+1$ substate as in the $M_F=-1$ substate of the $F=1$ hyperfine level. Whereas at thermal equilibrium the probability that an atom in the $3S_{1/2}$ ground state in the $F=2$, $M_F=+2$ substate is 0.12499, while the probability that an atom is in the $F=1$, $M_F=+1$ substate is 0.12502, after a single photon of sodium-D excitation is absorbed and re-emitted by each atom, the corresponding probabilities are 0.247 and 0.182. For the $\Delta M_F=+1$ microwave transition coupling these states this represents not only an increase in spectral line intensity of over twenty million, but also a negative absolute internal temperature, i.e., a condition in which more atoms are in the upper than in the lower of the two energy states of interest, this state being one in which the confined sodium vapor in bulb 2 exhibits negative attenuation. The frequency at which this effect occurs may be varied by changing the adjustment of rheostat 23. In the case of $Na^{23}$ the frequency may be varied upward from a nominal value of 1,771 megacycles and for $Cs^{133}$ from a nominal value of 9,192.6 megacycles.

As a result, there will be an overall gain from input path 35 to output path 36 and the frequency at which peak amplification is obtained may be varied by adjustment of the intensity of the magnetic field between pole pieces 18 and 19. By providing a suitable feedback path from output path 36 to input path 35, a tunable oscillator is obtained.

What is claimed is:

1. Electrical apparatus for exciting a microwave molecular resonant medium comprising means for irradiating said medium with photon energy of a frequency for which said medium is resonant to produce photon induced transitions between quantum energy states of said medium, means for applying a microwave magnetic field to said medium in a first direction, means for applying a static magnetic field to said medium in a direction substantially perpendicular to the direction of said microwave magnetic field, means for adjusting the relative intensities of said magnetic fields with respect to each other to tune said medium, and means for providing electrical coupling to said medium.

2. Electrical apparatus for exciting a microwave molecular resonant medium comprising means for irradiating said medium with photon energy of a frequency for which said medium is resonant to produce photon induced transitions between quantum energy states of said medium, means for applying a microwave magnetic field at another resonant frequency to said medium in a first direction, means for applying a static magnetic field to said medium in a direction substantially perpendicular to the direction of said microwave magnetic field, means for adjusting the intensity of said static field to tune said medium, and means for providing electrical coupling to said medium.

3. Electrical apparatus for exciting a microwave molecular resonant medium comprising means for irradiating said medium with photon energy of a frequency for which said medium is resonant to produce photon induced transitions between quantum energy states of said medium, means for applying a microwave magnetic field at another resonant frequency to said medium in a first direction, means for applying a static magnetic field to said medium in a direction substantially perpendicular to the direction of said microwave magnetic field, means for adjusting the intensity of said static field to tune said medium, and means for coupling microwave energy from said irradiated medium at a frequency for which said medium is resonant.

4. Apparatus according to claim 3 wherein said photon energy is circularly polarized.

5. Electrical apparatus for exciting a microwave molecular resonant medium comprising a cavity resonator surrounding said medium, means for irradiating said medium with photon energy of a frequency for which said medium is resonant to produce photon induced transitions between quantum energy states of said medium, means for introducing microwave energy into said resonator in a circular mode for applying a microwave magnetic field at another resonant frequency to said medium, means for applying a static magnetic field to said medium in a direction substantially perpendicular to the direction of said microwave magnetic field, means for adjusting the intensity of said static field to tune said medium, and means for providing electrical coupling to said medium.

6. Apparatus according to claim 5 wherein said photon energy is circularly polarized.

7. Apparatus according to claim 6 wherein the polarization axis of said photon energy is parallel to the axis of said circular mode of operation of said resonator.

8. Apparatus according to claim 5, in which said medium consists of a single element in gaseous form and said source of photon energy also includes said single element in a photon energy emitting state.

9. Apparatus according to claim 5, further comprising a transparent vapor confining member disposed in said resonator, said medium being retained within said confining member, and adjustable heating means associated with said confining member for varying the vapor pressure of said medium.

10. Apparatus according to claim 5, further comprising hybrid means connected to said resonator, and input and output circuits for said apparatus extending through said hybrid means.

11. Apparatus according to claim 10, in which said hybrid means includes an unused circuit, said apparatus further comprising terminating means connected to said unused circuit for damping and preventing undesired modes of operation.

References Cited in the file of this patent

UNITED STATES PATENTS

| | | |
|---|---|---|
| 2,705,284 | Hershberger | Mar. 29, 1955 |
| 2,707,235 | Townes | Apr. 26, 1955 |

FOREIGN PATENTS

| | | |
|---|---|---|
| 109,162 | Sweden | Nov. 30, 1943 |

OTHER REFERENCES

Publication: "The Microwave Gyrator," by C. L. Hogan, Tele-Tech and Electronics Industries, November 1954, pages 64–66, 137–140.